(12) United States Patent
Lee et al.

(10) Patent No.: US 11,496,134 B2
(45) Date of Patent: Nov. 8, 2022

(54) DIFFERENTIAL ACTIVATED LATCH FOR GAN BASED LEVEL SHIFTER

(71) Applicant: Efficient Power Conversion Corporation, El Segundo, CA (US)

(72) Inventors: Edward Lee, Fullerton, CA (US); Ravi Ananth, Laguna Niguel, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 17/349,020

(22) Filed: Jun. 16, 2021

(65) Prior Publication Data

US 2021/0399731 A1 Dec. 23, 2021

Related U.S. Application Data

(60) Provisional application No. 63/041,588, filed on Jun. 19, 2020.

(51) Int. Cl.
*H03L 5/00* (2006.01)
*H03K 5/22* (2006.01)
*H03K 19/0185* (2006.01)
*H03K 3/037* (2006.01)

(52) U.S. Cl.
CPC ..... *H03K 19/018507* (2013.01); *H03K 3/037* (2013.01)

(58) Field of Classification Search
CPC ..... G11C 7/065; G11C 7/062; G11C 11/4091; H03K 3/356139; H03K 3/012; H03K 5/2481; H03K 5/249; H03K 5/2418; H04L 25/0272; H03F 3/45183

USPC .............................................. 327/55, 65, 333
See application file for complete search history.

(56) References Cited

U.S. PATENT DOCUMENTS

| | | | |
|---|---|---|---|
| 5,508,648 A * | 4/1996 | Banik | H03K 3/35625 327/203 |
| 9,525,410 B2 | 12/2016 | Kim et al. | |
| 10,505,519 B1 * | 12/2019 | Chen | H03K 3/0233 |
| 2011/0249518 A1 | 10/2011 | Liles et al. | |
| 2015/0042396 A1 * | 2/2015 | Koudate | H03K 3/356113 327/333 |
| 2015/0229302 A1 * | 8/2015 | Kim | H03K 5/249 327/52 |
| 2016/0028378 A1 * | 1/2016 | Moriuchi | H03K 5/249 327/64 |

FOREIGN PATENT DOCUMENTS

| | | |
|---|---|---|
| DE | 10 2007 050049 A1 | 4/2009 |
| EP | 3518419 A1 | 7/2019 |
| WO | WO 01/75941 A2 | 10/2001 |

OTHER PUBLICATIONS

International Search Report and Written Opinion from PCT/US2021/037663 dated Oct. 14, 2021.
(Continued)

*Primary Examiner* — Quan Tra
(74) *Attorney, Agent, or Firm* — Blank Rome LLP (57) ABSTRACT

A cross-coupled differential activated latch circuit with circuitry comprising a plurality of n-FETs and inverters that can be implemented completely in GaN. The circuitry prevents the digital latched values on the outputs of the latch from changing unless the digital input values on the inputs are different, thus preventing common-mode voltage on the inputs from corrupting the stored latch values.

8 Claims, 8 Drawing Sheets

(56) References Cited

OTHER PUBLICATIONS

Z. Liu et al., "Design of On-Chip Gate Drivers with Power-Efficient High-Speed Level Shifting and Dynamic Timing Control for High-Voltage Synchronous Switching Power Converters," IEEE Journal of Solid-State Circuits, vol. 50, No. 6, Jun. 2015.

* cited by examiner

DIFFERENTIAL ACTIVATED LATCH FOR GaN BASED LEVEL SHIFTER

CROSS-REFERENCE TO RELATED APPLICATION

This application claims the benefit of U.S. Provisional Application No. 63/041,588 filed Jun. 19, 2020, the disclosure of which is incorporated by reference in its entirety.

BACKGROUND OF THE INVENTION

Figures 1A, 1B:
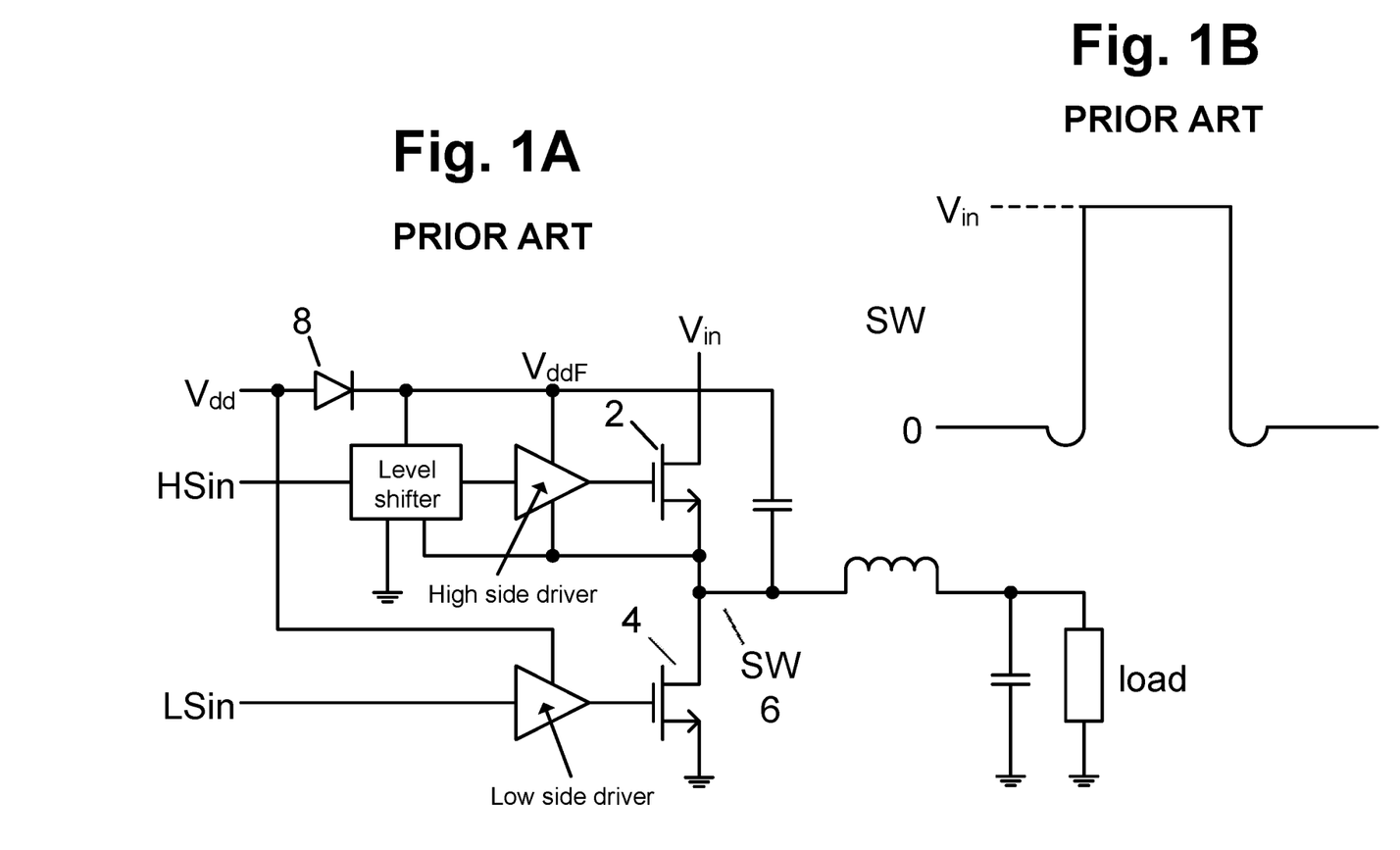
FIG. 1A shows a typical prior art half bridge design.
FIG. 1B shows the voltage at the SW node as the circuit switches.

In a typical half-bridge IC design, shown in FIG. 1A, the on or off of the high side FET 2 is determined by the high side input signal 4, which is usually referenced to ground. However, when the high side FET 2 is turned on, SW node 6, which is the low supply voltage of the high side path, will be equal to the input voltage $V_{in}$ (see FIG. 1B), and the floating supply voltage $V_{ddF}$ will be about $V_{dd}-V_D+V_{in}$ where $V_D$ is the diode voltage drop of diode 8. Since $V_{in}$ can range from a couple of volts to a few hundreds of volts, a level shifter is required to level shift the high side input signal 4 from a ground referenced signal to a signal referenced to node 6 at the input of the high side driver.

Figure 2:
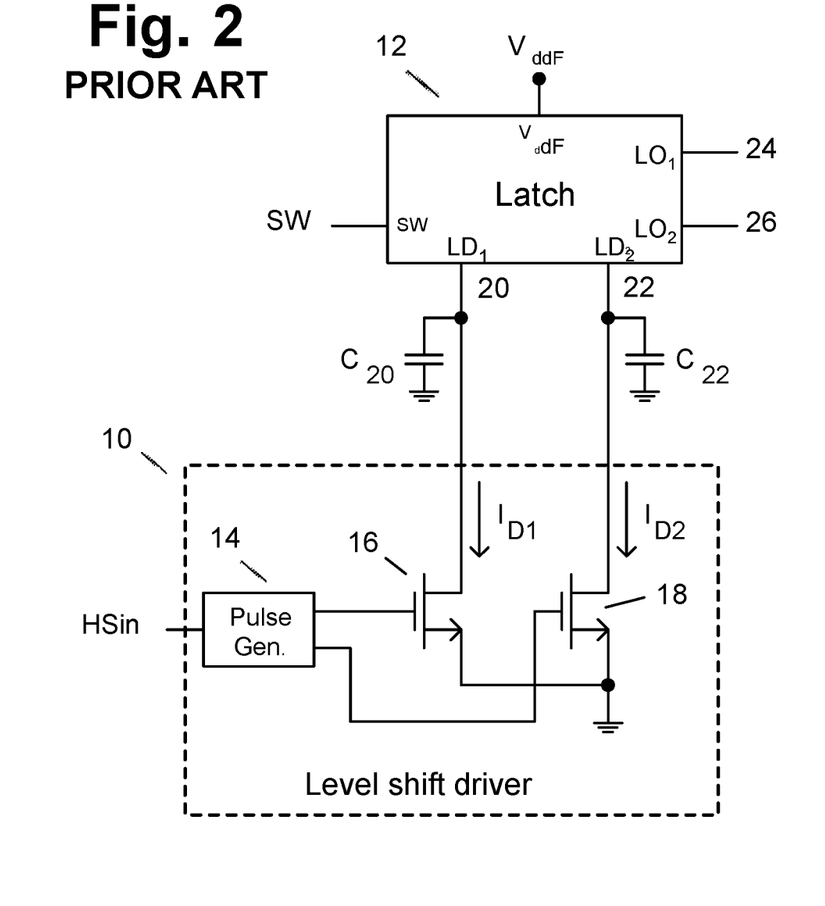
FIG. 2 is a block diagram of a typical prior art level shifter.

FIG. 2 is a block diagram of a typical prior art level shifter. The level shifter contains two parts—the level shift driver 10 and the latch 12. To change the logic value of the latch 12, a pulse generator 14 in the level shift driver 10 generates a pulse on the gate of either FET 16 or FET 18. The drain current on either FET 16 or FET 18 (referred to as the differential current) will then pull down either input 20 or input 22 of latch 12 to produce a differential voltage change on latch input 20 or latch input 22. This differential voltage change causes the desired logic change in the outputs 24 and 26 of latch 12. Importantly, for proper operation, the logic change in outputs 24 and 26 should occur only when latch input 20 is different than latch input 22, i.e., when there is differential voltage change at the latch inputs. Latch outputs 24 and 26 should not change state if latch inputs 20 and 22 are the same, i.e., both low or both high.

$C_{20}$ and $C_{22}$ are the parasitic capacitances associated with latch inputs 20 and 22. The latch is referenced to SW node 6, which can have fast swings between 0V and $V_{in}$. Due to the relatively large currents required to quickly charge/discharge $C_{20}$ and $C_{22}$, the voltage levels on latch input 20 and latch input 22, which are referenced to SW node 6, may not be maintained when fast positive/negative slope (dv/dt) common-mode changes occur at SW node 6. Undesirable common-mode voltage changes on latch inputs 20 and 22 (i.e., both high or both low) can hence be introduced due to the rapid change in the voltage at SW node 6.

Figure 3:
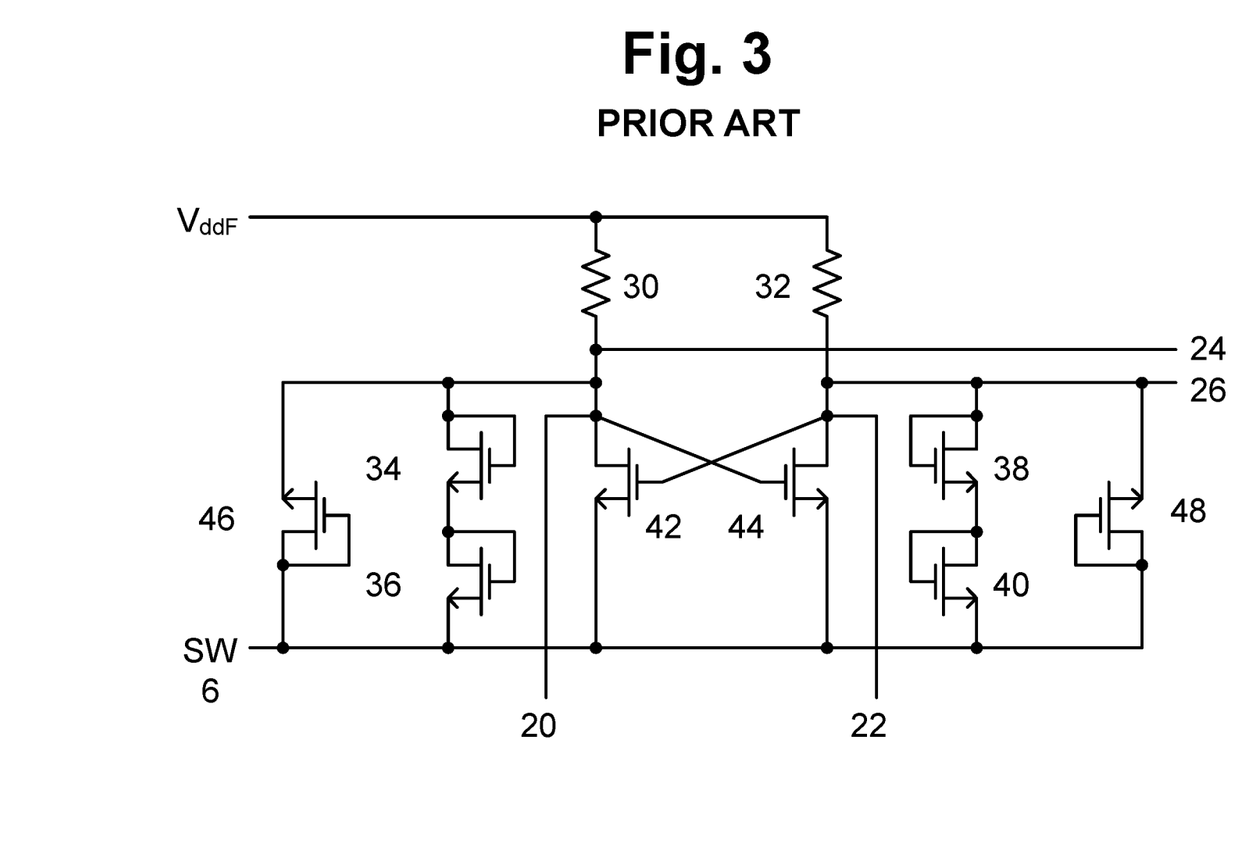
FIG. 3 shows the circuitry of a simple prior art cross-coupled latch.

FIG. 3 shows the circuitry of a simple cross-coupled latch, where voltage $V_{ddF}$ is a floating supply with respect to SW 6. Differential current on latch inputs 20 and 22 pulls current through resistor 30 or resistor 32, producing the desired logic values on latch outputs 24 and 26. Undesired common-mode current on latch inputs 20 and 22 (i.e., both high or both low) due to fast positive or negative dv/dt on SW node 6 will turn FETs 42 and 44 both on or off, pulling down or pulling up both latch outputs 24 and 26. As a result, the desired logic value stored in the latch may be corrupted.

In the prior art cross-coupled latch of FIG. 3, diode-connected FETs 34, 36, 38 and 40 are used to protect the gate voltages of the main latch FETs 42 and 44 from large positive common-mode voltage. Diode-connected FETs 46 and 48 are used to protect the gate voltages of main latch FETs 42 and 44 from large negative common-mode voltages.

Figure 4A:
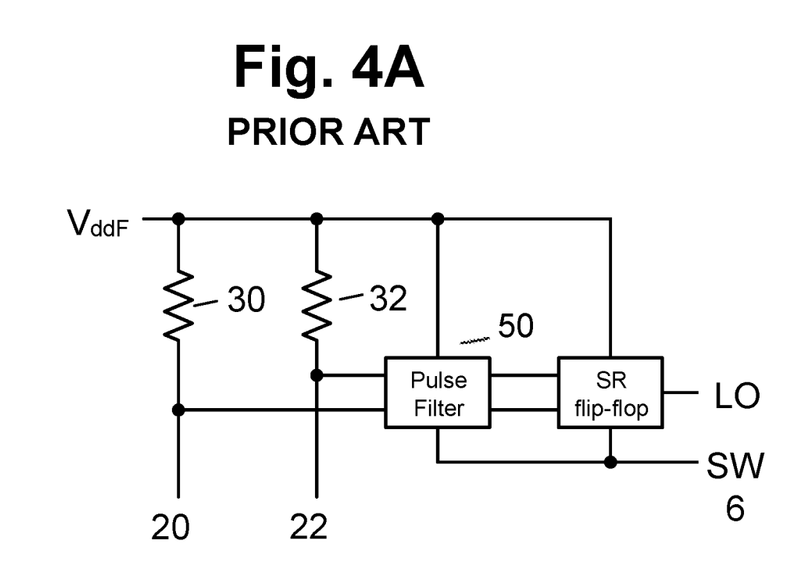
FIGS. 4A and 4B show a simple prior art SR flip-flop circuit which functions as a latch.
Figure 4B:
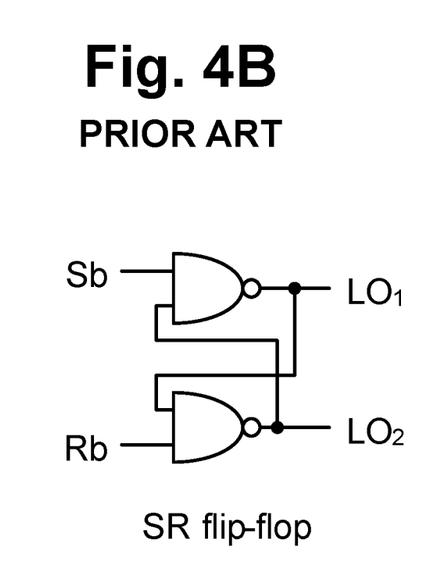

FIGS. 4A and 4B show a simple prior art SR flip-flop circuit which functions as a latch. Diode-connected FETs for protection are required at latch inputs 20 and 22. Pulse filter 50 is usually realized using digital inverters/buffers, delay circuits and/or Schmitt triggers to clean up voltage pulses on latch inputs 20 and 22 and to produce clean digital input pulses to the SR flip-flop. As with the cross-coupled latch, common-mode current on latch inputs 20 and 22 due to fast positive dv/dt on SW node 6 will pull down both latch inputs 20 and 22. As a result, the desired logic value stored in the latch may be corrupted. Note that with this circuit, the logic value stored in the latch will not be corrupted by fast negative dv/dt on SW node 6 because if both latch inputs 20 and 22 are high, the outputs will not change state.

Figure 5:
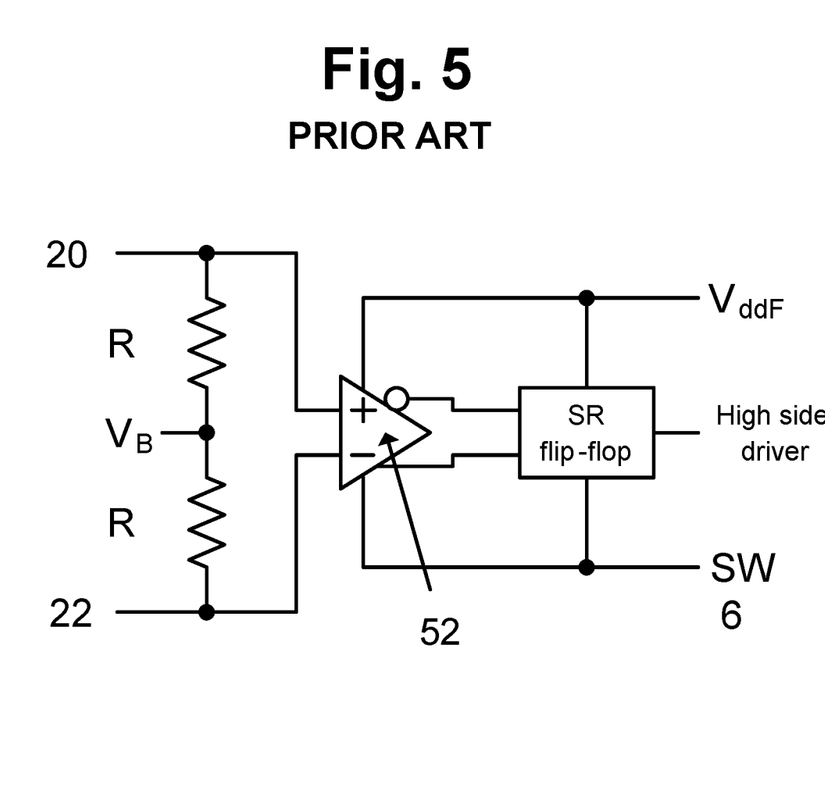
FIG. 5 shows a SR flip-flop latch with an analog differential front-end amplifier.

FIG. 5 shows a SR flip-flop latch with an analog differential front-end amplifier. Differential amplifier 52 is used to reject common-mode voltage and amplifies the differential voltage on latch inputs 20 and 22 for setting the SR flip-flop, thereby avoiding the above-noted problem with the circuit of FIG. 4 when subjected to fast positive dv/dt on the SW 6 node. However, differential amplifier 52 may require a wide input common-mode range (e.g., rail-to-rail or larger). Also, a high-speed differential amplifier will result in high power dissipation. Finally, like the cross-coupled latch of FIG. 3, diode-connected FETs for protection are required at latch inputs 20 and 22.

Figure 6:
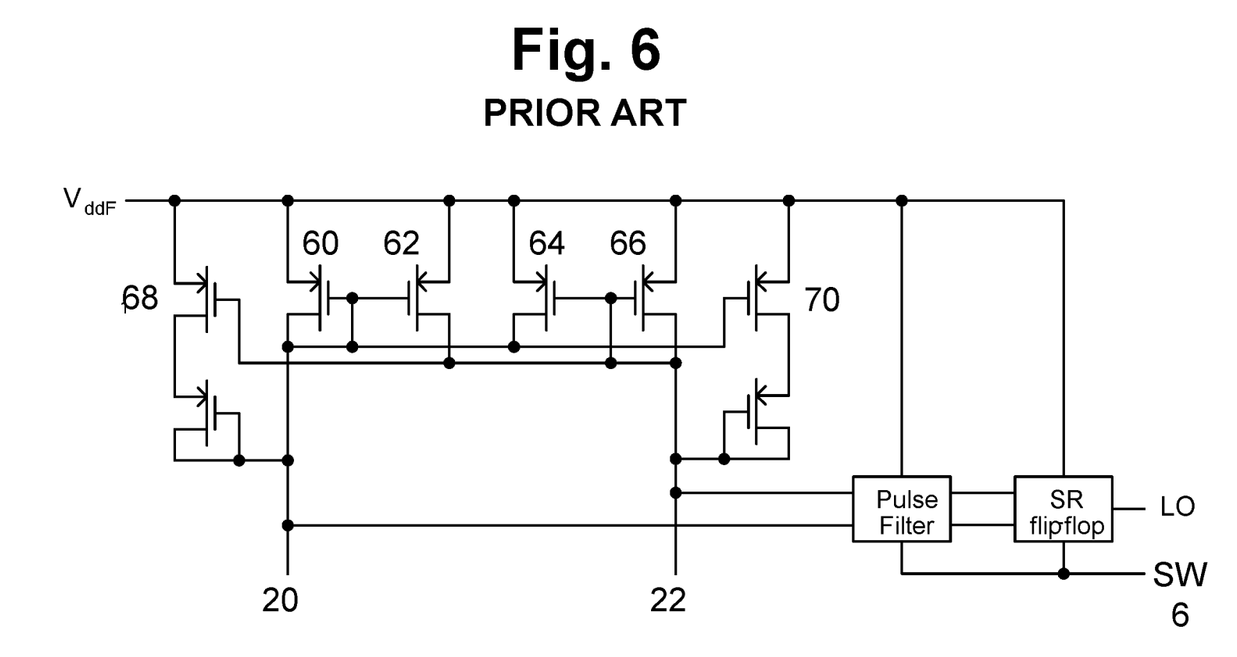
FIG. 6 shows a prior art circuit for common-mode current rejection using a dynamic current source.

FIG. 6 shows a prior art circuit for common-mode current rejection using a dynamic current source. FETs 60, 62, 64 and 66 act as a cross-coupled differential load, converting the differential current to differential voltage at latch inputs 20 and 22. Common-mode pull-down current at latch inputs 20 and 22 due to fast positive dv/dt on SW node 6 will pull down both inputs 20 and 22. The pull-down current will also activate FETs 68 and 70 (dynamic current sources) that generate a common-mode pull-up current to counteract the common-mode pull down current. However, the circuit of FIG. 6 cannot be realized in GaN processes since the required p-FETs are not possible to implement in GaN technology.

It would therefore be desirable to provide a latch that overcomes the disadvantages of the prior art latches described above, i.e., a differential activated latch circuit that can be implemented using GaN processes.

SUMMARY OF THE INVENTION

The present invention overcomes the disadvantages and achieves the objectives described above by providing a cross-coupled differential activated latch circuit with first and second latch inputs for receiving first and second digit input values, first and second latch outputs, and first and second n-FETs connected in a cross-coupled arrangement, and with circuitry comprising a plurality of n-FETs and inverters for preventing the digital latched values on the first and second outputs from changing unless the digital input values on the first and second inputs are different.

In a first preferred embodiment, the circuitry of the present invention implements the following logic function:

First Output = ((FirstInput)·SecondInput+SecondOutput)

Second Output = ((SecondInput)·FirstInput+FirstOutput)

In a second preferred embodiment, the circuitry of the present invention implements the following logic function:

$$\text{First Output} = \overline{(\text{SecondOutput}) \cdot ((\overline{\text{FirstInput}}) + \text{SecondInput})}$$

$$\text{Second Output} = \overline{(\text{FirstOutput}) \cdot ((\overline{\text{SecondInput}}) + \text{FirstInput})}$$

The circuits of the present invention, which can be implemented entirely in GaN, are advantageously designed so that the latch outputs 24 and 26 will not change if both logic inputs are the same, i.e., both low or both high, thus avoiding common-mode voltage on the inputs from corrupting the stored latch values.

Although the present invention is designed to be implemented in GaN technology, it can also be implemented in other technologies such as CMOS by implementing the above logic functions, such that the logic outputs of the latch will not be corrupted by the fast positive or negative dv/dt on the SW node 6 in FIG. 1A.

Other features and advantages of the present invention will become apparent when the following description is read in conjunction with the accompanying drawings.

DETAILED DESCRIPTION OF THE PREFERRED EMBODIMENTS

Figure 7:
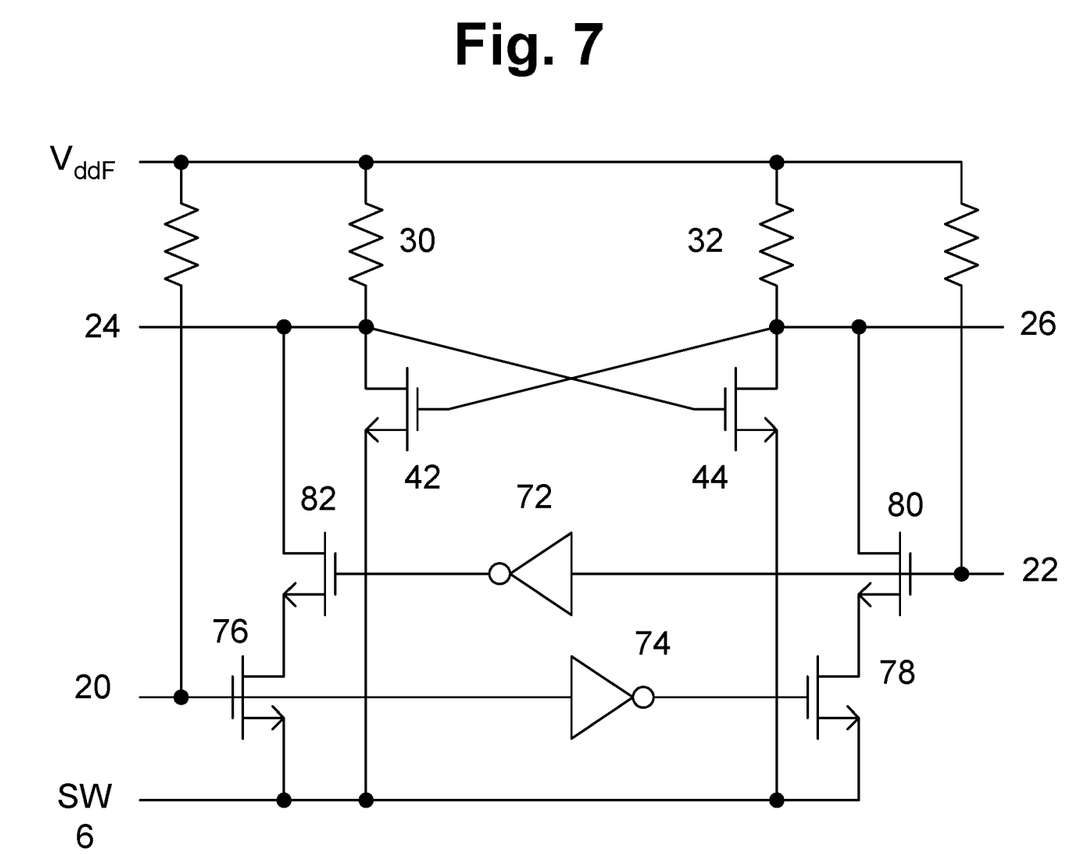
FIG. 7 shows a first embodiment of the differential activated cross-coupled latch of the present invention.

FIG. 7 shows a first embodiment of the circuit of the present invention, a differential activated cross-coupled latch that does not require p-FETs and can be implemented using GaN processes. The latch value is changed only with differential digital inputs on latch inputs 20 and 22. Common-mode voltage on latch inputs 20 and 22 is treated as digital inputs with the same logic values. The circuit is advantageously designed with inverters 72 and 74 and associated circuitry so that the latch outputs 24 and 26 will not change if both logic inputs are the same, i.e., both low or both high.

Specifically, if both latch inputs 20 and 22 simultaneously become logic low, n-FETs 76 and 80 are turned off, blocking pull down of latch outputs 24 and 26, and maintaining the output logic levels. A logic high on both latch inputs 20 and 22 will turn on n-FET 76 and n-FET 80, and, via inverters 72 and 74, will also turn off n-FET 78 and n-FET 82, thereby blocking pull down of latch outputs 24 and 26 and maintaining the output logic levels. As a result, a common-mode signal appearing as the same logic signal at the latch inputs due to fast positive and negative dv/dt at the SW node 6 in FIG. 1A will not corrupt the latch outputs. A pull down path for current to flow from VddF to SW6 through resistor 30 (and to thereby to bring latch output 24 low and keep latch output 26 high) is only created when latch input 20 is high and latch input 22 is low. Likewise, a pull down path for current to flow from VddF to SW6 through resistor 32 (and to thereby to bring latch output 26 low and keep latch output 24 high) is only created when latch input 20 is low and latch input 22 is high. Thus, the latched value can only be changed with differential digital input values on latch inputs 20 and 22.

The differential activated latch of the first embodiment of the present invention can be considered as having two feedback connected, complex gates with the following two logic functions:

$$\text{Output } 24 = \overline{((\text{Input20}) \cdot \overline{\text{Input22}} + \overline{\text{Output26}})}$$

$$\text{Output } 26 = \overline{((\text{Input22}) \cdot \overline{\text{Input20}} + \overline{\text{Output24}})}$$

As explained above, the output logic value can only be changed by pulling down either latch output 24 or latch output 26. Diode-connected n-FETs for protection are required at inputs 20 and 22, as in the prior art cross-coupled latch circuit of FIG. 3.

Figure 8:
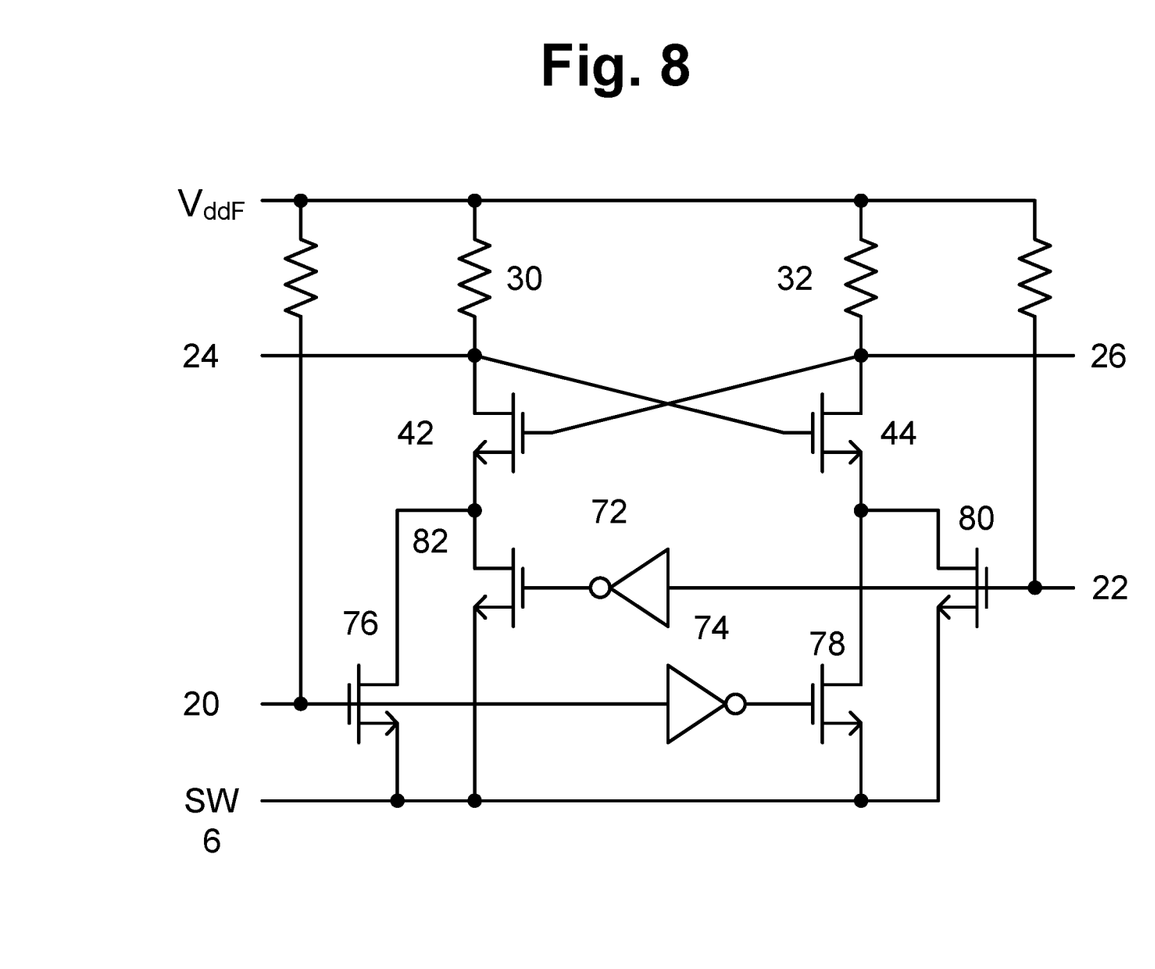
FIG. 8 shows a second embodiment of the differential activated cross-coupled latch of the present invention.

FIG. 8 shows a second embodiment of the differential activated latch of the present invention. The output logic values are changed by turning off n-FET 42 or n-FET 44 and letting resistor 30 or resistor 32 pull up latch output 24 or latch output 26.

More specifically, in the embodiment of FIG. 8, if both latch inputs 20 and 22 simultaneously become logic low, n-FETs 76 and 80 are turned off, but both n-FETs 78 and 82 will be turned on due to inverters 74 and 72, respectively. As a result, n-FETs 42 and 44 are connected to SW 6, and the logic outputs on 24 and 26 will maintain the same output logic levels.

When both latch inputs 20 and 22 simultaneously become logic high, both n-FETs 76 and 80 will be turned on, but n-FETs 78 and 82 will be turned off due to inverters 72 and 74. Nevertheless, n-FETs 42 and 44 are still connected to SW 6 and the latch outputs on 24 and 26 will maintain the same logic levels. As a result, common-mode signal appearing as the same logic signal at the latch inputs due to fast positive and negative dv/dt at the SW node 6 in FIG. 1A will not corrupt the latch outputs.

When latch input 20 is low and latch input 22 is high, n-FETs 76 and 82 are both off, such that n-FET 42 is disconnected from SW 6 and resistor 30 pulls up latch output 24. At the same time, n-FET 44 is connected to SW 6 and the latch output 26 will be pulled down by n-FET 44, since n-FET 80 is turned on due to logic high at the latch input 22, and n-FET 78 is also turned on due to inverter 74 with logic low at the latch input 20.

When latch input 20 is high and latch input 22 is low, n-FETs 80 and 78 are both off, such that n-FET 44 is disconnected from SW 6, and resistor 32 pulls up latch output 26. At the same time, n-FET 42 is connected to SW 6 and the latch output 24 will be pulled down by n-FET 42, since n-FET 76 is turned on due to the logic high at the latch input 20, and n-FET 82 is also turned on due to inverter 72 with logic low at the latch input 22.

The differential activated latch of this second embodiment of the present invention can be considered as having two feedback connected, complex gates with the following two logic functions:

$$\text{Output } 24 = \overline{(\text{Output26}) \cdot ((\overline{\text{Input20}}) + \text{Input22})}$$

Output 26=(Output24)·((Input22)+Input20)

Diode-connected n-FETs are required for protection at latch inputs 20 and 22 as in the prior art cross-coupled latch circuit and the first embodiment of the present invention. Other implementations are possible to realize the logic functions in the first and second embodiments of the invention.

An optional pulse filter can be added at latch inputs 20 and 22 in both embodiments of the present invention.

The differential activated latch of the present invention has a number of advantages over the prior art latch circuits described above. For example, the differential control-signal activated latches of the present invention require less power dissipation than the prior art approach of FIG. 5 using an SR flip-flop with a differential front-end amplifier, since the latter approach requires a continuous biasing current to achieve high-speed operation. In addition, a small difference on the common-mode signal at latch input 20 and latch input 22 can make the prior art circuit using a differential amplifier and SR flip-flop react incorrectly to the common-mode signal. The circuit of the present invention will reject this small differential signal when it is less than the noise margin of the logic gates.

Compared to the dynamic current source approach of FIG. 6, the circuit of the present invention does not require p-FETs and can be readily realized in a GaN or NMOS only process. The circuitry of the present invention described above is preferably implemented entirely in GaN.

The circuit of the present invention can, in theory, withstand an infinite positive or negative dv/dt on SW node 6, as long as the gate-to-source voltages of the n-FETs connected to latch inputs 20 and 22 are clamped by diode-connected protection FETs to be within the maximum allowable value.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A cross-coupled differential activated latch circuit, comprising:
    first and second inputs for receiving digital input values;
    first and second outputs for outputting digital latched values;
    first and second n-FETs connected in a cross-coupled arrangement, with a gate of each of same first and second n-FETs electrically connected to a drain of the other one of the first and second n-FETs, wherein the drain of the first n-FET is connected to the first output, and the drain of the second n-FET is connected to the second output;
    first and second resistors connected between a voltage source and the first and second outputs, respectively, for pulling up the voltage at the first and second outputs, respectively, when the first and second n-FETs, respectively, are turned off;
    a node SW having a changing voltage; and
    circuitry comprising a plurality of n-FETs and inverters connected to the first and second inputs, the first and second outputs, the first and second cross-coupled n-FETs and the node SW, for preventing common mode signals caused by the changing voltage on the node SW from affecting the digital latched values of the first and second outputs, such that the digital latched values on the first and second outputs only change if the digital input values on the first and second inputs are opposite to each other.

2. The cross-coupled differential activated latch circuit of claim 1, wherein the plurality of n-FETs comprise:
    third and fourth n-FETs electrically coupled in series, wherein a drain of the third n-FET is connected to the gate of the second n-FET, the source of the third n-FET is connected to a drain of the fourth n-FET, and wherein a gate of the fourth n-FET is connected to the first input, and a gate of the third n-FET is connected to an inverse of the second input; and
    fifth and sixth n-FETs electrically coupled in series, wherein a drain of the fifth n-FET is connected to the gate of the first n-FET, the source of the fifth n-FET is connected to a drain of the sixth n-FET, and wherein a gate of the fifth n-FET is connected to the second input, and a gate of the sixth n-FET is connected to an inverse of the first input.

3. The cross-couple differential activated latch circuit of claim 2, wherein the circuitry implements the logic function:

First Output= $\overline{((\text{FirstInput})\cdot\text{SecondInput}+\text{SecondOutput})}$ Second Output= $\overline{((\text{SecondInput})\cdot\text{FirstInput})+\text{FirstOutput})}$.

4. The cross-coupled differential activated latch circuit of claim 1, wherein the plurality of n-FETs comprise:
    third and fourth n-FETs electrically coupled in parallel, wherein a drain of the third n-FET is connected to a drain of the fourth n-FET and a source of the third n-FET is connected to a source of the fourth n-FET, and wherein a gate of the third n-FET is connected to the first input, and a gate of the fourth n-FET is connected to an inverse of the second input; and
    fifth and sixth n-FETs electrically coupled in parallel, wherein a drain of the fifth n-FET is connected to a drain of the sixth n-FET and a source of the fifth n-FET is connected to a source of the sixth n-FET, and wherein a gate of the fifth n-FET is connected to the second input and a gate of the sixth n-FET is connected an inverse of the first input.

5. The cross-couple differential activated latch circuit of claim 4, wherein the circuitry implements the logic function:

First Output= $\overline{(\text{SecondOutput})\cdot((\text{FirstInput})+\text{SecondInput})}$ Second Output= $\overline{(\text{FirstOutput})\cdot((\text{SecondInput})+\text{FirstInput})}$.

6. The cross-coupled differential activated latch circuit of claim 1, wherein the circuitry is implemented entirely in GaN.

7. The cross-coupled differential activated latch circuit of claim 1, further comprising a pulse filter at each of the first and second inputs.

8. The cross-coupled differential activated latch circuit of claim 1, wherein the first and second latch inputs are clamped by diode-connected protection n-FETs.

* * * * *